(12) United States Patent
Tanaka et al.

(10) Patent No.: US 7,830,146 B2
(45) Date of Patent: Nov. 9, 2010

(54) NMR SOLENOIDAL COIL FOR RF FIELD HOMOGENEITY

(75) Inventors: Hideki Tanaka, Hitachi (JP); Tsuyoshi Wakuda, Hitachinaka (JP)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 11/655,208

(22) Filed: Jan. 19, 2007

(65) Prior Publication Data
US 2007/0188174 A1 Aug. 16, 2007

(30) Foreign Application Priority Data
Feb. 15, 2006 (JP) .............................. 2006-037778

(51) Int. Cl.
G01V 3/00 (2006.01)
H01Q 1/48 (2006.01)
H01Q 7/00 (2006.01)

(52) U.S. Cl. ........................ 324/318; 343/845; 343/870

(58) Field of Classification Search ......... 324/300–322; 600/410–435; 333/219–235; 343/703, 741–744, 343/824–833, 843–849, 866–876, 893–899, 343/904–906
See application file for complete search history.

(56) References Cited

U.S. PATENT DOCUMENTS

| | | | | |
|---|---|---|---|---|
| 3,584,293 | A * | 6/1971 | Iizuka | 324/303 |
| 4,208,633 | A * | 6/1980 | Krause | 330/56 |
| 4,816,766 | A * | 3/1989 | Zabel et al. | 324/318 |
| 4,833,410 | A * | 5/1989 | Briguet et al. | 324/318 |
| 5,689,189 | A * | 11/1997 | Morich et al. | 324/318 |
| 6,029,082 | A * | 2/2000 | Srinivasan et al. | 600/422 |
| 6,958,608 | B2 * | 10/2005 | Takagi et al. | 324/318 |
| 7,138,801 | B2 * | 11/2006 | Yamamoto et al. | 324/318 |

2003/0210051 A1 11/2003 Aihara et al.

(Continued)

FOREIGN PATENT DOCUMENTS

JP 07-023923 1/1995

(Continued)

OTHER PUBLICATIONS

A. F. Privalov, et al.; Coil Design for Large-Volume High-B1 Homogeneity for Solid-State NMR Applications; Journal of Magnetic Resonance, Series A 123; 1996; p. 157-160; Article No. 0229.

(Continued)

*Primary Examiner*—Dixomara Vargas
(74) *Attorney, Agent, or Firm*—Antonelli, Terry, Stout & Kraus, LLP.

(57) ABSTRACT

An NMR signal acquisition device that can increase the magnetic field homogeneity in a high frequency magnetic field by one of the following. (a) Current paths each having a different inductance are provided to adjust the diversion ratio of the current, (b) A current path branch point is provided in an intermediate part of the winding of a solenoidal coil so that there are more current paths in the intermediate part of the winding than in the current paths connected to the feeding points at both ends, (c) The radiuses of current paths are adjusted, (d) Winding pitches in the axis direction are adjusted, (e) Current path widths are adjusted, and (f) The solenoidal coil has both positive direction current paths and negative direction current paths.

11 Claims, 12 Drawing Sheets

U.S. PATENT DOCUMENTS

| | | |
|---|---|---|
| 2003/0210052 A1 | 11/2003 | Okada et al. |
| 2004/0046556 A1 | 3/2004 | Okada et al. |
| 2004/0245990 A1 | 12/2004 | Aihara et al. |
| 2005/0122112 A1 | 6/2005 | Aihara et al. |
| 2005/0248349 A1 | 11/2005 | Okada et al. |
| 2007/0279059 A1 | 12/2007 | Aihara et al. |

FOREIGN PATENT DOCUMENTS

| | | |
|---|---|---|
| JP | 2002-345777 | 12/2002 |
| JP | 2003-329755 A | 11/2003 |
| JP | 2003-329756 A | 11/2003 |
| JP | 2004-325251 A | 11/2004 |
| JP | 2004-325252 A | 11/2004 |
| JP | 2005-003435 A | 1/2005 |
| WO | WO 2004/095046 A | 11/2004 |
| WO | WO 2004/095047 A | 11/2004 |

OTHER PUBLICATIONS

S. Idziak, et al.; Design and Construction of a High Homogeneity rf Coil for Solid-State Multiple-Pulse NMR; Journal of Magnetic Resonance 50; 1982; p. 281-288.

* cited by examiner

NMR SOLENOIDAL COIL FOR RF FIELD HOMOGENEITY

BACKGROUND OF THE INVENTION

1. Field of the Invention

The present invention relates to a solenoidal coil used for measuring nuclear magnetic resonance (NMR) and to an NMR signal acquisition device on which the solenoidal coil is mounted, and more particularly to a solenoidal coil for an NMR signal for use as a transmitter-receiver coil, a transmitter coil, or a receiver coil and to an NMR signal acquisition device on which solenoidal coil is mounted.

2. Description of the Related Art

A saddle coil, a birdcage coil, or a solenoidal coil is used on an NMR signal measuring device to apply a high frequency magnetic field to a sample to be measured and to acquire the NMR signal from the sample. When a high frequency magnetic field is applied to a sample, the magnetic field intensity is required to be homogeneous in the sample space.

Although a multiple-turn coil is used to increase the sensitivity of a solenoidal coil, the magnetic field homogeneity in a high frequency magnetic field tends to decrease because the sensitivity area extends cylindrically. JP-A-2002-345777 (abstract) discloses a technology for increasing the magnetic field homogeneity at transmission time by flowing an equal amount of RF (Radio Frequency) current in each loop of the coil at transmission time.

As described above, there is a problem that the magnetic field homogeneity of a solenoidal coil in a high frequency magnetic field is low.

SUMMARY OF THE INVENTION

It is an object of the present invention to provide a solenoidal coil that increases the magnetic field homogeneity in a high frequency magnetic field and an NMR signal acquisition device on which the solenoidal coil is mounted.

The object of the present invention is achieved by any of configurations (1)-(6) described below.

(1) A solenoidal coil is configured in such a way that there are a plurality of current paths connecting the feeding points at both ends, a current path collection point is provided in the center of a winding, and the current paths are geometrically symmetric with respect to the center of the winding. This configuration provides current paths each with a different inductance, allows the current diversion ratio to be adjusted, and increases the magnetic field homogeneity in a high frequency magnetic field.

(2) A current path branch point and a current path collection point are provided in an intermediate part of a winding to provide more current paths in the intermediate part of the winding than in a part of the winding connected to feeding points at both ends. This configuration provides the current path branch point in the intermediate part of the winding to provide more current paths in the intermediate part of the winding than in the part of the winding connected to the feeding points at both ends, divides the current, and thus increases the magnetic field homogeneity in a high frequency magnetic field.

(3) The radiuses of current paths are made different according to a predetermined ratio. Changing the radiuses of current paths according to a predetermined ratio increases the magnetic field homogeneity in a high frequency magnetic field.

(4) The winding pitches in the coil axis direction are set to have predetermined distributions from the center of the coil toward the coil ends with the distributions symmetric with respect to the center of the coil. The winding pitches in the coil axis direction, which are set to have predetermined distributions from the center of the coil toward the coil ends so that the distributions are symmetric with respect to the center of the coil, increase the magnetic field homogeneity in a high frequency magnetic field.

(5) The current path widths in the coil axis direction are set to have predetermined distributions from the center of the coil toward the coil ends with the distributions symmetric with respect to the center of the coil. The current path widths, which are set to have predetermined distributions from the center of the coil toward the coil ends so that the distributions are symmetric with respect to the center of the coil, increase the magnetic field homogeneity in a high frequency magnetic field.

(6) A solenoidal coil has both a current path for generating a positive magnetic field and a current path for generating a negative magnetic field in the coil axis direction. The solenoidal coil, which has both the current path for generating a positive magnetic field and the current path for generating a negative magnetic field in the coil axis direction, increases the magnetic field homogeneity in a high frequency magnetic field.

The magnetic field homogeneity in a high frequency magnetic field can be further increased by appropriately combining configurations (1)-(6) described above.

The configurations according to the present invention adjust the distribution of the current, which is sent to a solenoidal coil, to increase the magnetic field homogeneity in a high-frequency magnetic field.

Other objects, features and advantages of the invention will become apparent from the following description of the embodiments of the invention taken in conjunction with the accompanying drawings.

DETAILED DESCRIPTION OF THE EMBODIMENTS

When the current path is wound equally spaced in the coil axis direction, the magnetic field in the center of the coil axis direction becomes strong and therefore the homogeneity decreases. The magnitude of a magnetic field is proportional to the amount of the electric current that serves as its source and is inversely proportional to the distance between the magnetic field observation point and the electric current. Therefore, to increase the homogeneity of a high frequency magnetic field, it is necessary to decrease the density of the electric current sent to the center of the coil axis or to keep the electric current away from the observation point. To do so, it is required to reduce the amount of the electric current flowing through one current path, to flow the inverse-direction electric current, or to keep the current path sufficiently spaced. Examples of increasing the magnetic field homogeneity in a high frequency magnetic field will be described in first to eighth embodiments.

It is desired that the homogeneity of the static magnetic field in a solenoidal coil for the NMR signal not be disturbed as much as possible. It is also desired to minimize the loss of the NMR signal. Those objects are achieved by fabricating a solenoidal coil in one of the methods (7)-(9) described below.

(7) The feeding point, current path, current path branch point, and current path collection point are composed of metal foils and metal wires. When the magnetic susceptibility of the metal is positive, the surface is coated with a metal of negative magnetic susceptibility; when the magnetic susceptibility of the metal is negative, the surface is coated with a metal of positive magnetic susceptibility.

(8) The thickness of the current path in the radial direction should be fabricated as thin as possible with the lower limit being the twice the skin depth determined by the transmission/reception frequency and the electrical conductivity of the metal.

(9) The feeding point, current path, current path branch point, and current path collection point are composed of superconductor thin films.

Examples that comprise the components satisfying the requirements (7)-(9) given above will be described in the ninth and tenth embodiments.

The present invention extends the measurement area of an NMR signal and exposes a homogenous high frequency magnetic field to a large sample to make it possible to make the NMR measurement of the large sample. In addition to increasing the magnetic field homogeneity in a high frequency magnetic field, the reception efficiency of the NMR signal received from a sample is increased as stated by the reciprocity theorem.

First Embodiment

Figure 1:
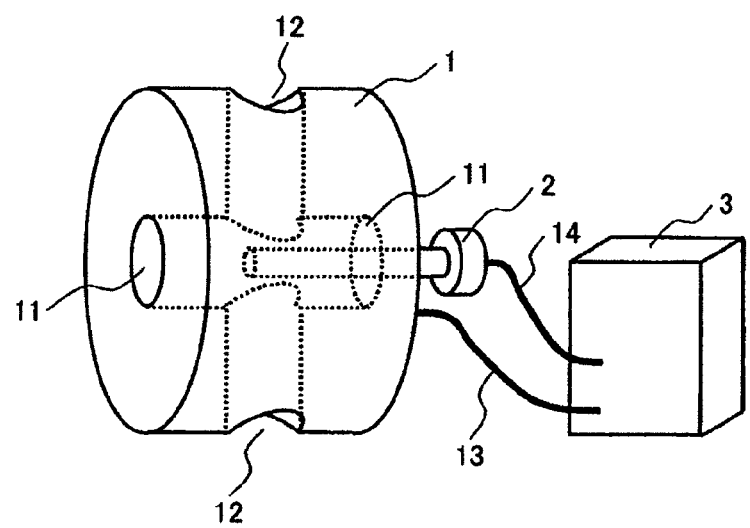
FIG. 1 is a diagram showing the overview of an NMR signal acquisition device.

FIG. 1 is a general diagram showing an example of an NMR signal measuring device. A static magnetic field generator 1 includes a superconducting magnet for generating a static magnetic field, and liquid helium or liquid nitrogen necessary for cooling the superconducting magnet. A probe 2 is inserted into the static magnetic field generator 1 from a static magnetic field magnet axial bore 11, a measurement sample is inserted from a static magnetic field magnet radial bore 12, and a control device 3 controls the static magnetic field, the gradient field, and the high frequency magnetic field via a magnetic signal line 13 and a probe signal line 14 to acquire the NMR signal.

Figure 2:
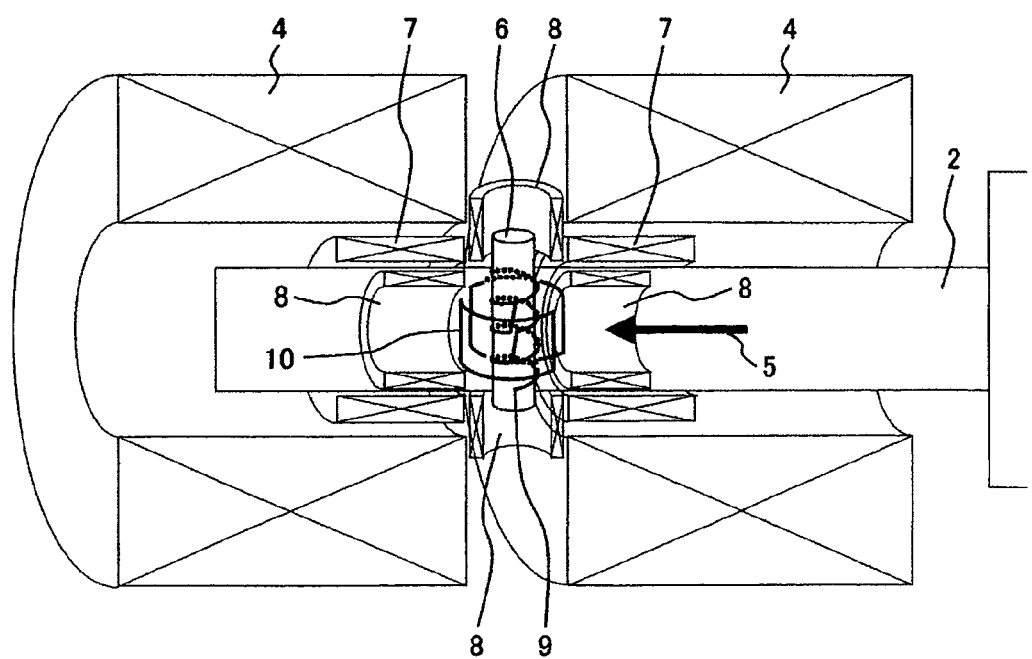
FIG. 2 is a cross section diagram showing the inside of a static magnetic field generator.

FIG. 2 is a partial cross section diagram showing the inside of the static magnetic field generator 1. A split type static magnetic field generation magnet 4 generates a static magnetic field, which is in a static magnetic field direction 5, in a sample space 6. Using the split type static magnetic field generation magnet 4 allows the open space for the sample space 6 to be provided not only in the static magnetic field magnet axial direction but also in the static magnetic field magnet radial direction. This open space allows various devices to be installed, such as a sample rotation device, a sample temperature adjustment device, and a mechanism to give an impetuous (for example, a light) to a sample. An electric current, adjusted by the control device 3, is sent to a static magnetic field homogeneity compensation magnet 7 to increase the magnetic field homogeneity in the sample space 6. A current is also sent to a gradient field magnet 8 as necessary to generate a gradient field in the sample space 6 in the one-axis or three-axis direction. After a predetermined magnetic field distribution is created in the sample space 6, an inner coil 9 or an outer coil 10 is used to generate a high-frequency magnetic field and receives the NMR signal. Although FIG. 2 shows two coils, that is, the inner coil 9 and the outer coil 10, a third coil may also be added as necessary.

Although an impedance matching circuit and a resonance frequency adjustment circuit are required between those coils and the probe signal line 14, they omitted here. The solenoidal coil of the present invention is used for a coil that applies a high-frequency magnetic field to the sample space 6 and a coil that acquires the NMR signal, such as the inner coil 9 or the outer coil 10.

All the solenoidal coils of the present invention are geometrically symmetric with respect to the center of the winding. For the sake of the description, the rings are called a first ring, a second ring, and so on, beginning with the bottom ring.

Figure 3:
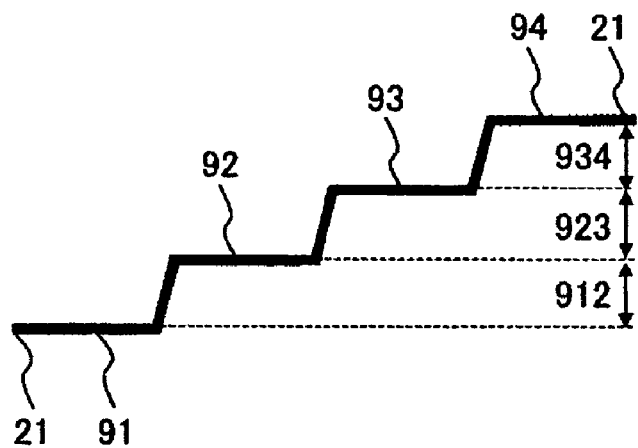
FIG. 3 is a current path diagram when a solenoidal coil in a comparison example is developed.
Figure 4:
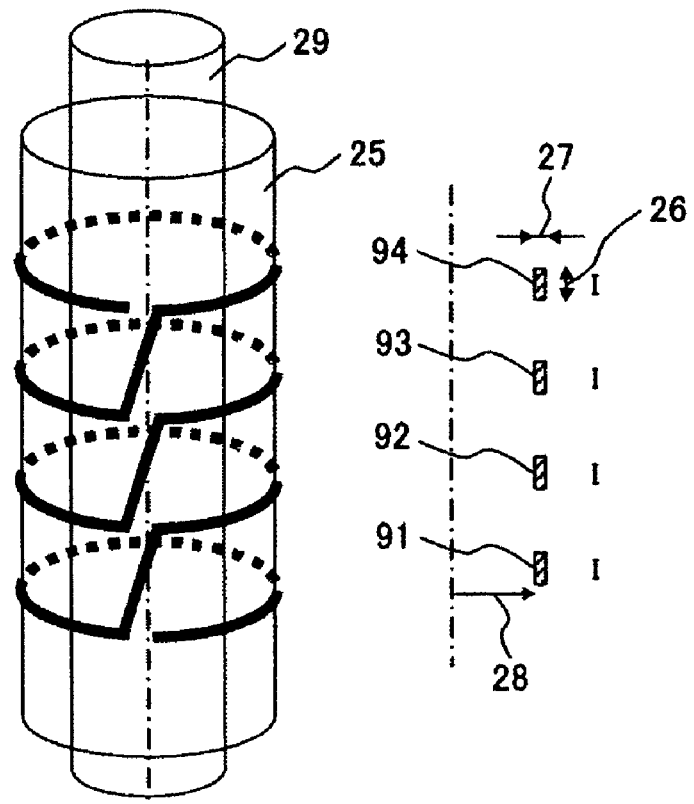
FIG. 4 is a current path layout diagram and a current path cross section diagram of a solenoidal coil in the comparison example.

First, the following describes a comparison example with reference to FIG. 3 and FIG. 4 to compare the effect of the present invention with that of the comparison example. FIG. 3 is a current path development diagram showing a solenoidal coil wherein one current path is connected to a feeding point 21, the number of winding turns is four, the winding pitch is equally spaced in the coil axis direction, there is a stepwise change in the coil axis direction, and the cross section of the winding is a rectangle. A stepwise change refers to a change in the winding position of the current path in which there is no change in the winding position with respect to the coil axis direction in one ring part but there is a change in the winding position at a specific point in the stepwise manner in the coil axis direction between each two rings. In this comparison example, a coil axis direction winding pitch 912 between a first ring 91 and a second ring 92, a coil axis direction winding pitch 923 between the second ring 92 and a third ring 93, and a coil axis direction winding pitch 934 between the third ring 93 and a fourth ring 94 are all equal, and all rings have the same current path radius 28.

FIG. 4 shows the shape of the current path and the cross section of the current path after the current path shown in the development diagram in FIG. 3 is wound like a coil. The solenoidal coil can be created easily by creating the pattern shown in FIG. 3 from the coil material and then by winding the created pattern around a cylindrical bobbin 25 as shown in FIG. 4. FIG. 4 is a general diagram showing that the pattern shown in FIG. 3, which has a current path width 26 and a current path thickness 27, is created from a thin film material and the created pattern is wound like a coil, and the rectangles representing the first to fourth rings show the cross section of the current path. Although the cross section of the current path in FIG. 4 is a rectangle, the solenoidal coil may also be created using a wire whose cross section is a circle. The homogeneity of a high frequency magnetic field, which generated in a sample space 29 when a high frequency current is supplied to such a solenoidal coil, is improved by the means described below.

Figure 5:
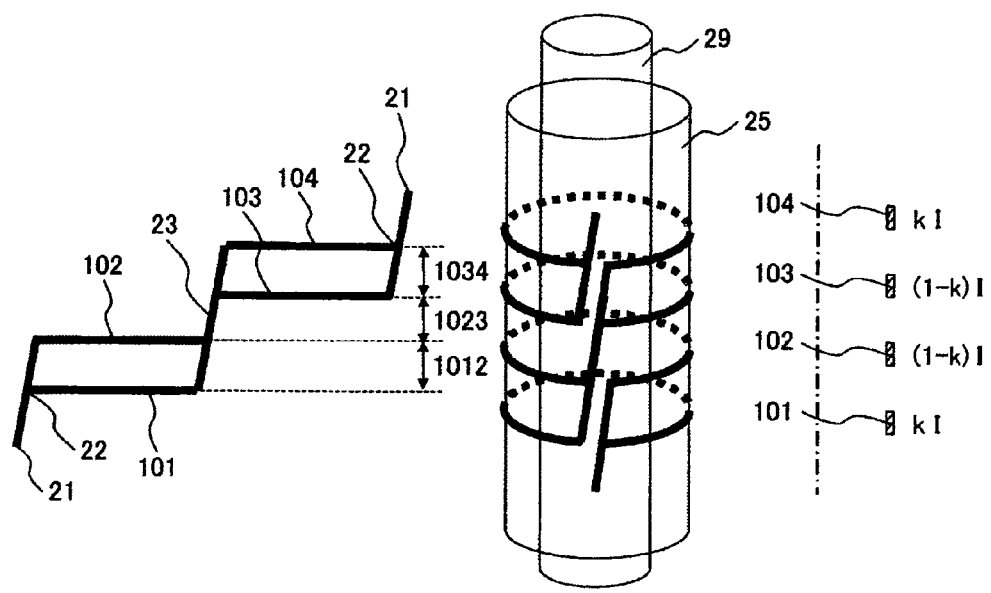
FIG. 5 is a current path development diagram, a current path layout diagram, and a current path cross section diagram of a solenoidal coil in a first embodiment.

FIG. 5 is a current path development diagram, a current path winding state diagram, and a current path cross section diagram of a solenoidal coil that has two current paths connecting a current path branch point 22 and a current path collection point 23 and that has the current path collection point 23 in the center of the winding. A coil axis direction winding pitch 1012 between a first ring 101 and a second ring 102, a coil axis direction winding pitch 1023 between the second ring 102 and a third ring 103, and a coil axis direction winding pitch 1034 between the third ring 103 and a fourth ring 104 are all equal, and all rings have the same current path radius. The second ring 102, which has an inter linkage with the magnetic flux generated by the current flowing through the first ring 101 and the third ring 103, has an inductance higher than that of the first and fourth rings. Similarly, the third ring has an inductance higher than that of the first and fourth rings. Because the current path is geometrically symmetric with respect to the center of the winding, the first and fourth rings have an equal inductance and the second and third rings have an equal inductance. In general, when the current is divided into parallel current paths, the current division rate is determined in inverse proportion to the inductance of the current paths. Therefore, when the current I is supplied from the feeding point 21, k becomes larger than ½ because the current flowing through the first and fourth rings is larger where kI is the current flowing through the first and fourth rings and (1−k)I is the current flowing through the second and third rings. As a result, the current density in the center of the coil axis becomes lower than that of the comparison example, meaning that the homogeneity of the high frequency magnetic field is improved.

Although two current paths are used in this embodiment, the solenoidal coil can be implemented when three or more current paths are provided in parallel or when the current path moves spirally into the coil axis direction as described in a second embodiment that will be described later.

Second Embodiment

In this embodiment, the current branch point is provided at an intermediate point of the winding of a solenoidal coil, and more current paths are provided in an intermediate point of the winding than the current paths connected to the feeding points at the both ends. The parts except the solenoidal coil are the same as those in the first embodiment and, therefore, the following describes only the solenoidal coil.

Figure 6:
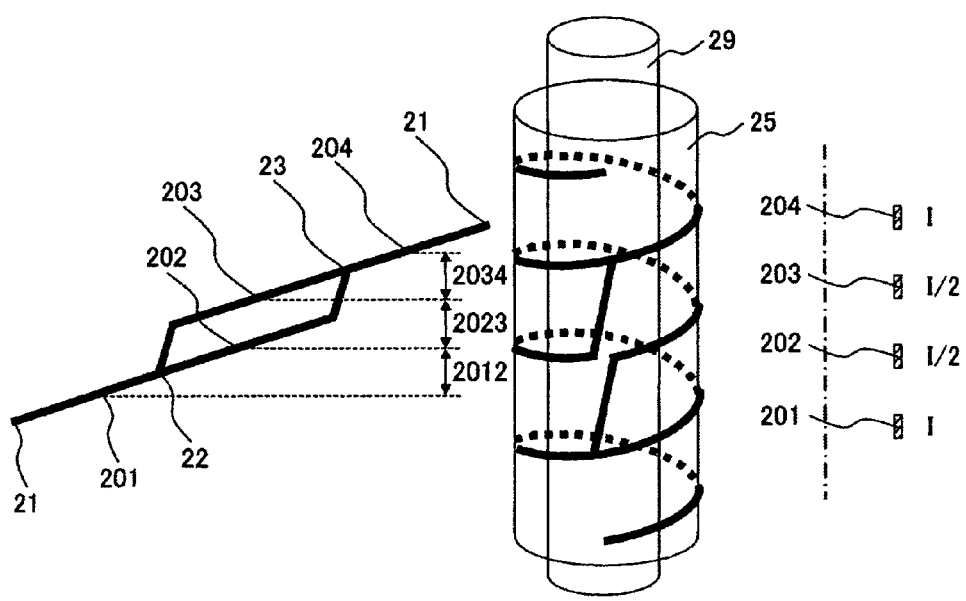
FIG. 6 is a current path development diagram, a current path layout diagram, and a current path cross section diagram of a solenoidal coil in a second embodiment.

FIG. 6 is a current path development diagram, a current path winding state diagram, and a current path cross section diagram of a solenoidal coil in which only a first ring 201 is connected to a feeding point 21, the current path is divided into two rings (second ring 202 and third ring 203) at a current path branch point 22 in an intermediate point of the winding, a current path collection point 23 is provided at a position in length symmetric to the current path branch point 22 with respect to the center of the length of the winding, and the current paths are collected again in a fourth ring 204 so that the geometrical symmetry with respect to the center of the length of the winding is maintained. Unlike the comparison example and the first embodiment, the current paths are connected smoothly between rings and moved spirally into the coil axis direction. When the current path moves spirally into the coil axis direction, the distance between the centers of the rings is defined as the winding pitch. In this embodiment, coil axis direction winding pitches 2012, 2023, and 2034 are all equal, and all rings have the same current path radius.

Because the two rings, 202 and 203, between the current path branch point 22 and the current path collection point 23 are geometrically symmetric, their resistance values, inductance values, and distances from the surrounding structure are equal and the impedances of the two rings become equal. Therefore, when the current transmitted to the feeding point is I, the current of I flows through the first and fourth rings and the current of I/2 flows through the second and third rings. Adjusting the current distribution in this way can increase the magnetic field homogeneity in the high frequency magnetic field.

Although the current path moves spirally into the coil axis direction in this embodiment, the solenoidal coil can be implemented by moving the current path in the stepwise manner as in the first embodiment. Although the current path is increased from one to two in this embodiment with the current-path branch point as its border, the solenoidal coil can also be implemented by increasing the current paths from two to three or from three to five and so forth.

Third Embodiment

In this embodiment, the current path radius is changed. The parts except the solenoidal coil are the same as those in the first embodiment and, therefore, the following describes only the solenoidal coil.

Figure 7:
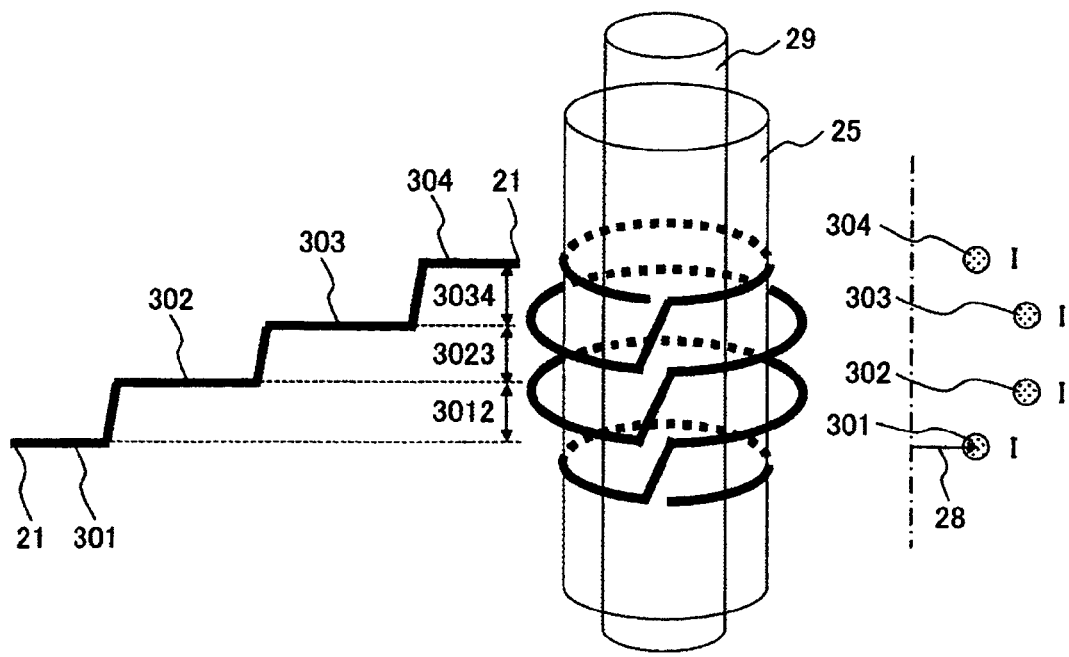
FIG. 7 is a current path development diagram, a current path layout diagram, and a current path cross section diagram of a solenoidal coil in a third embodiment.

FIG. 7 is a current path development diagram, a current path winding state diagram, and a current path cross section diagram of a solenoidal coil in which a current path radius 28 of a second ring 302 and a third ring 303 is set larger than the current path radius 28 of a first ring 301 and a fourth ring 304. Coil axis direction winding pitches 3012, 3023, and 3034 are all equal. Although the cross section of the coil is a circle and the current path moves in the stepwise manner into the coil axis direction in this embodiment, the solenoidal coil may also be implemented by using a wire having a rectangle cross section as in the first embodiment or by moving the current path spirally into the coil axis direction as in the second embodiment.

Because the radius of the second and third rings is larger, the magnetic field generated in the center in the coil axis direction by the second and third rings becomes weaker and therefore the magnetic field homogeneity in a high frequency magnetic field is increased.

Fourth Embodiment

In this embodiment, the coil axis direction winding pitch varies. The parts except the solenoidal coil are the same as those in the first embodiment and, therefore, the following describes only the solenoidal coil.

Figure 8:
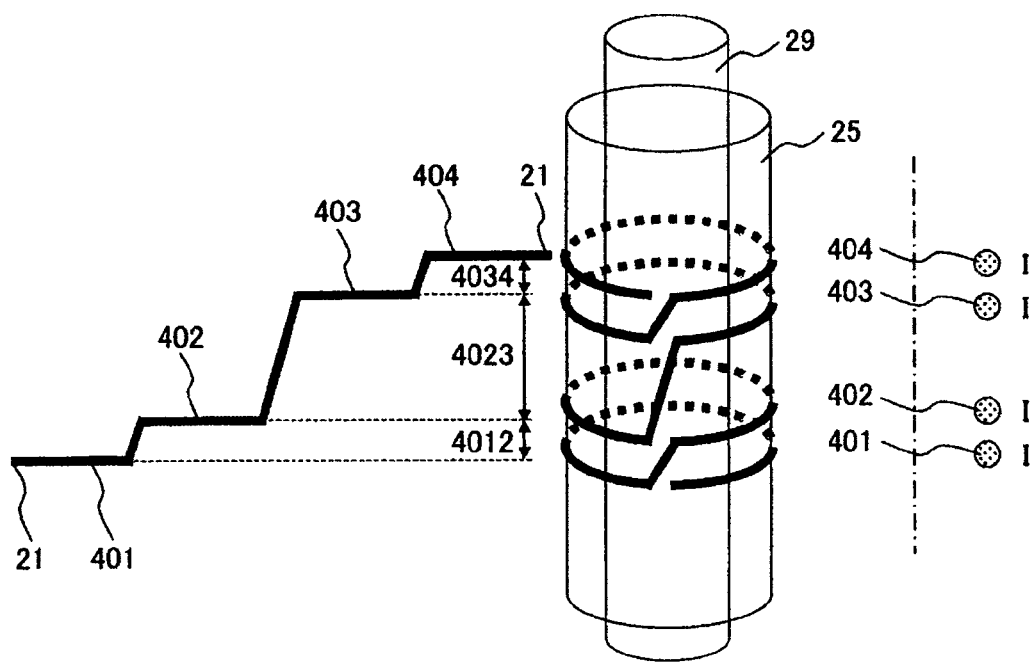
FIG. 8 is a current path development diagram, a current path layout diagram, and a current path cross section diagram of a solenoidal coil in a fourth embodiment.

FIG. 8 is a current path development diagram, a current path winding state diagram, and a current path cross section diagram of a solenoidal coil in which a coil axis direction winding pitch 4012 between a first ring 401 and a second ring 402 and a coil axis direction winding pitch 4034 between a third ring 403 and a fourth ring 404 are made smaller than a coil axis direction winding pitch 4023 between the second ring 402 and the third ring 403. The coil axis direction winding pitch 4012 and the coil axis direction winding pitch 4034 are equal. The first, second, third, and fourth rings have the same radius. Although the cross section of the coil is a circle and the current path moves in the stepwise manner into the coil axis direction in this embodiment, the solenoidal coil may also be implemented by using a wire having a rectangle cross section as in the first embodiment or by moving the current path spirally into the coil axis direction as in the second embodiment.

Providing the second and third rings away from the center of the coil in the coil axis direction causes the second and third rings to generate a weaker magnetic field in the center of the coil axis direction and, as a result, increases the magnetic field homogeneity in a high frequency magnetic field. It is desirable that an appropriate value be selected, because the coil axis direction winding pitch or the pitch between the neighboring current paths, if too low, would generate a proximity effect that increases the resistance.

Fifth Embodiment

Figure 9:
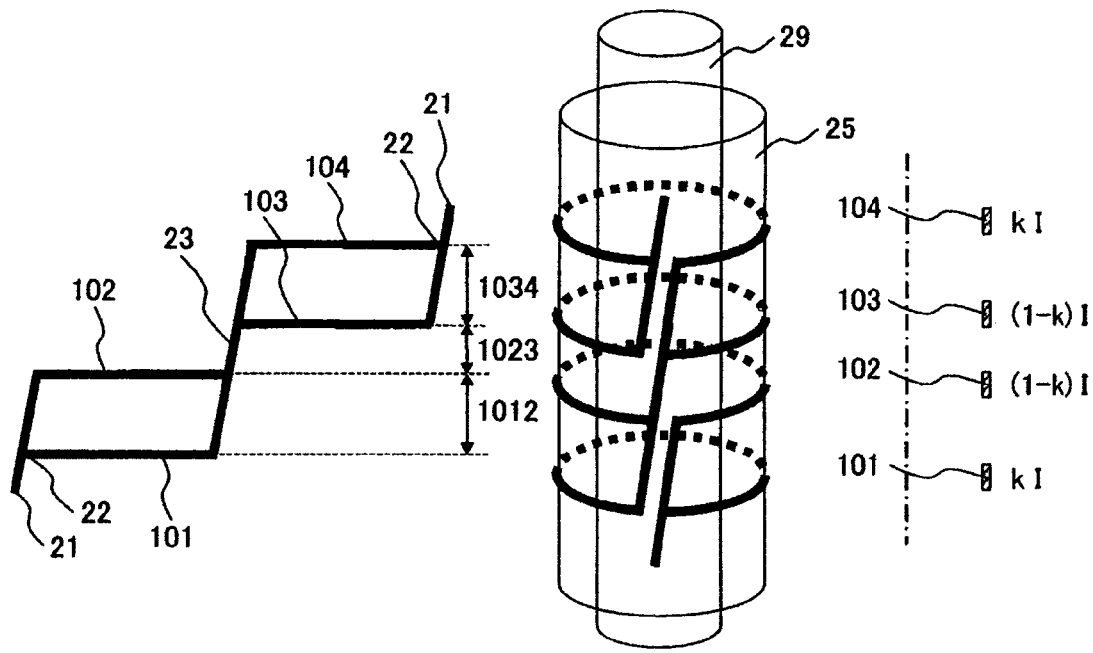
FIG. 9 is a current path development diagram, a current path layout diagram, and a current path cross section diagram of a solenoidal coil that has the characteristics of the first and fourth embodiments.
Figure 10:
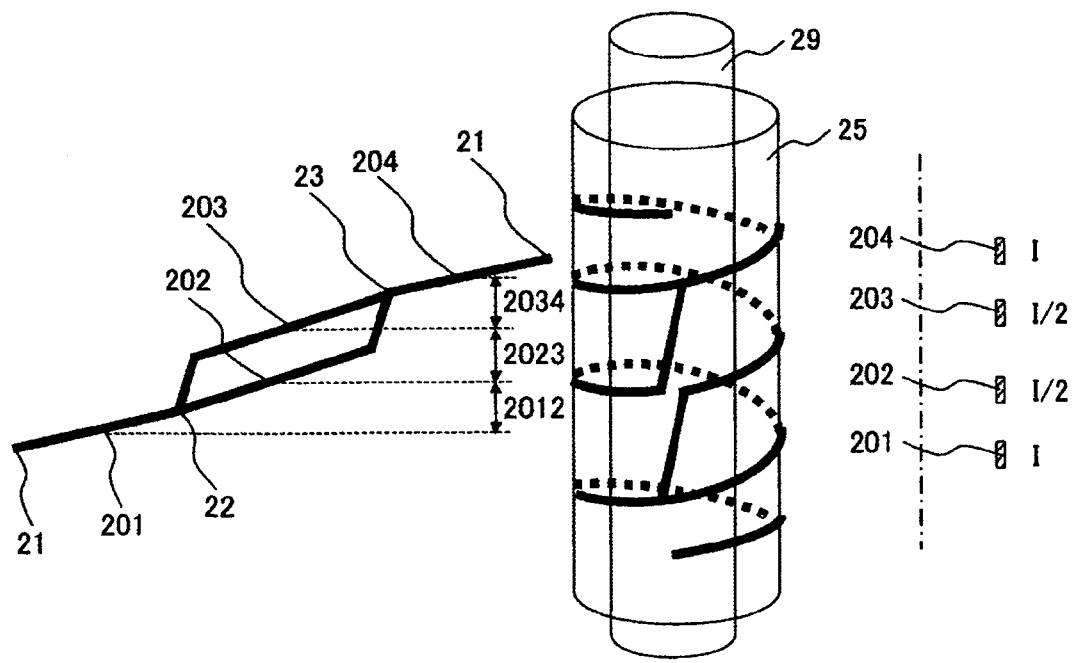
FIG. 10 is a current path development diagram, a current path layout diagram, and a current path cross section diagram of a solenoidal coil that has the characteristics of the second and fourth embodiments.
Figure 11:
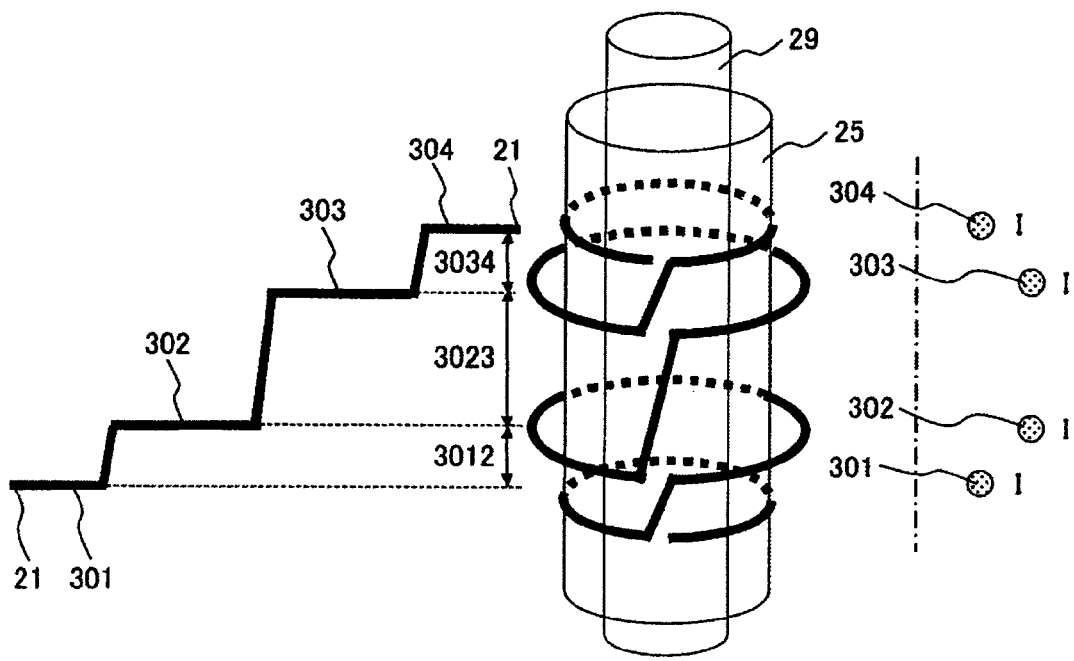
FIG. 11 is a current path development diagram, a current path layout diagram, and a current path cross section diagram of a solenoidal coil that has the characteristics of the third and fourth embodiments.

FIG. 9 is a current path development diagram, a current path winding state diagram, and a current path cross section diagram of a solenoidal coil that has the characteristics of the first embodiment and the fourth embodiment. FIG. 10 is a current path development diagram, a current path winding state diagram, and a current path cross section diagram of a solenoidal coil that has the characteristics of the second embodiment and the fourth embodiment. FIG. 11 is a current path development diagram, a current path winding state diagram, and a current path cross section diagram of a solenoidal coil that has the characteristics of the third embodiment and the fourth embodiment.

Any of those configurations further increases the magnetic field homogeneity in a high frequency magnetic field.

Sixth Embodiment

In this embodiment, the current path width is adjusted. The parts except the solenoidal coil are the same as those in the first embodiment and, therefore, the following describes only the solenoidal coil.

Figure 12:
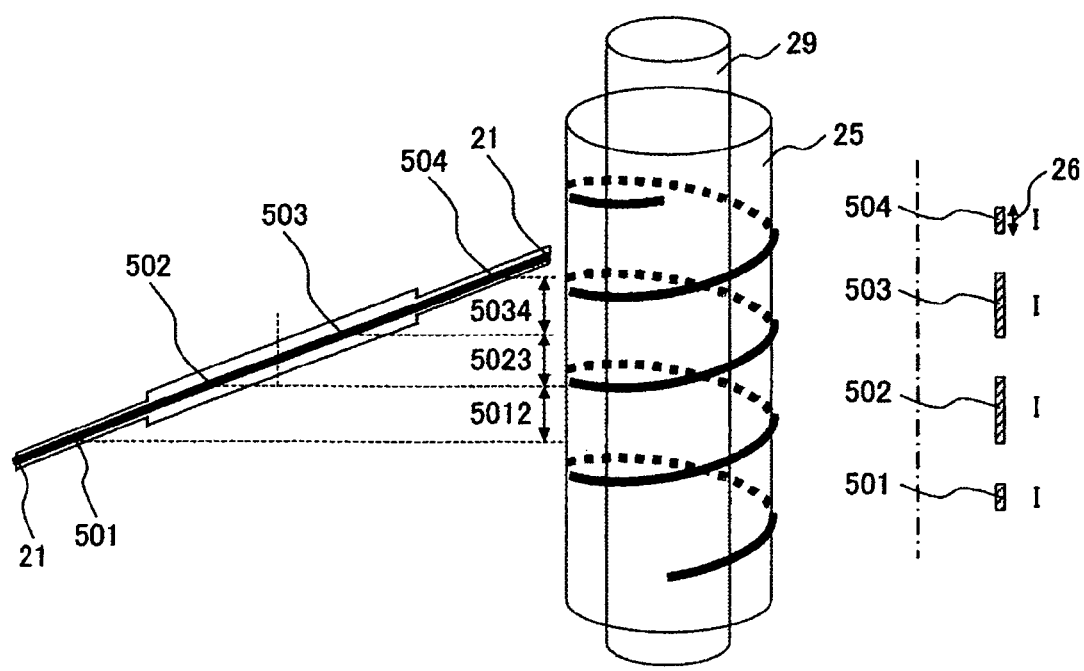
FIG. 12 is a current path development diagram, a current path layout diagram, and a current path cross section diagram of a solenoidal coil in a sixth embodiment.

FIG. 12 is a current path development diagram, a current path winding state diagram, and a current path cross section diagram of a solenoidal coil in which a current path width 26 of a second ring 502 and a third ring 503 is made larger than the current path width of a first ring 501 and a fourth ring 504. Coil axis direction winding pitches 5012, 5023, and 5034 are all equal. Although the current path moves spirally into the coil axis direction in this embodiment, the solenoidal coil can be implemented also by moving the current path in the stepwise manner in the coil axis direction.

Making the current path width of the second and third rings larger to provide the electric current distribution away into the coil axis direction causes the second and third rings to generate a weaker magnetic field in the center of the coil axis direction and, as a result, increases the magnetic field homogeneity in the high frequency magnetic field.

Seventh Embodiment

Figure 13:
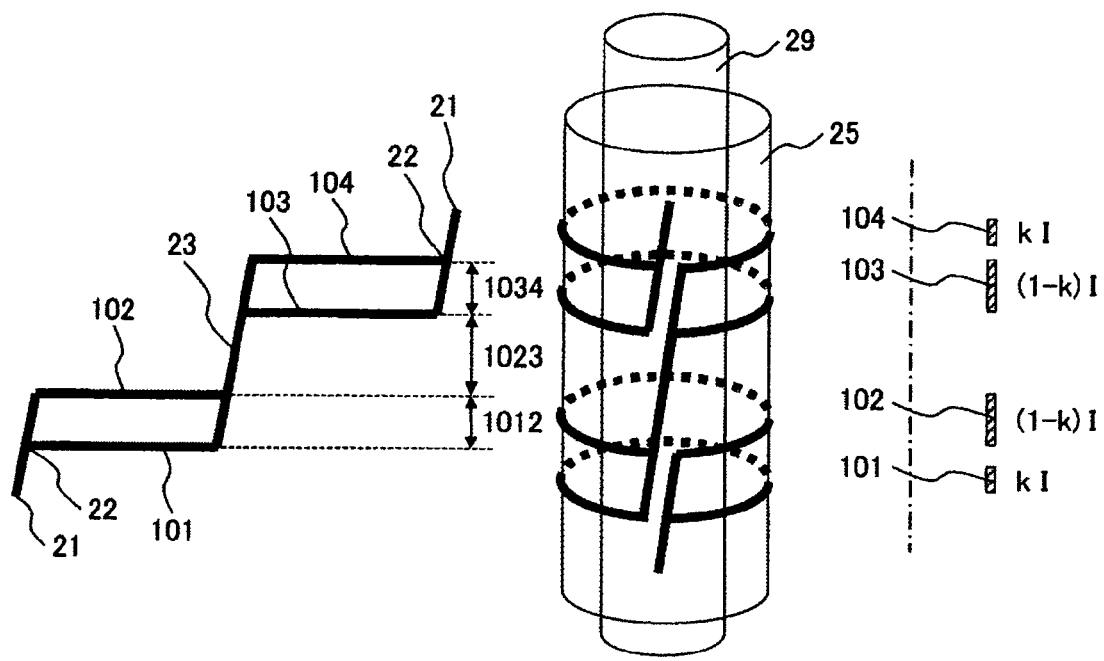
FIG. 13 is a current path development diagram, a current path layout diagram, and a current path cross section diagram of a solenoidal coil that has the characteristics of the first, fourth, and sixth embodiments.
Figure 14:
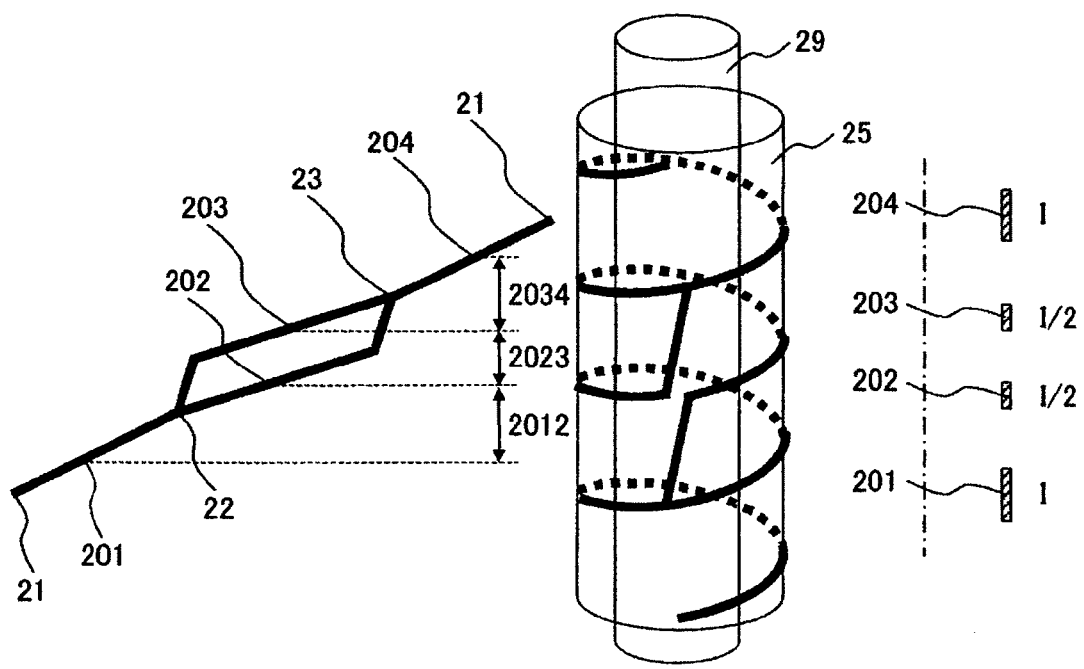
FIG. 14 is a current path development diagram, a current path layout diagram, and a current path cross section diagram of a solenoidal coil that has the characteristics of the second, fourth, and sixth embodiments.
Figure 15:
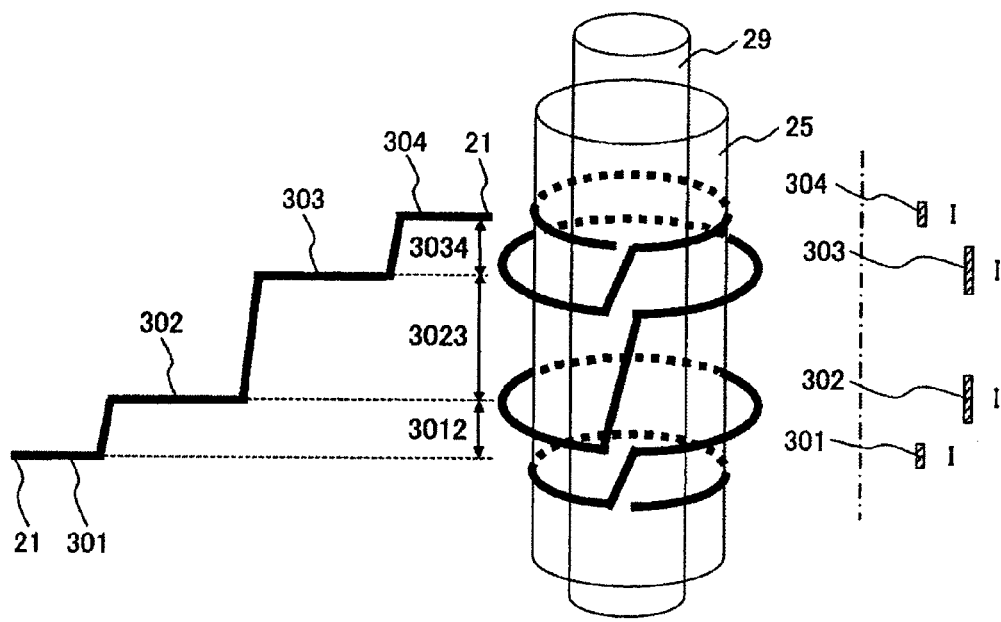
FIG. 15 is a current path development diagram, a current path layout diagram, and a current path cross section diagram of a solenoidal coil that has the characteristics of the third, fourth, and sixth embodiments.
Figure 16:
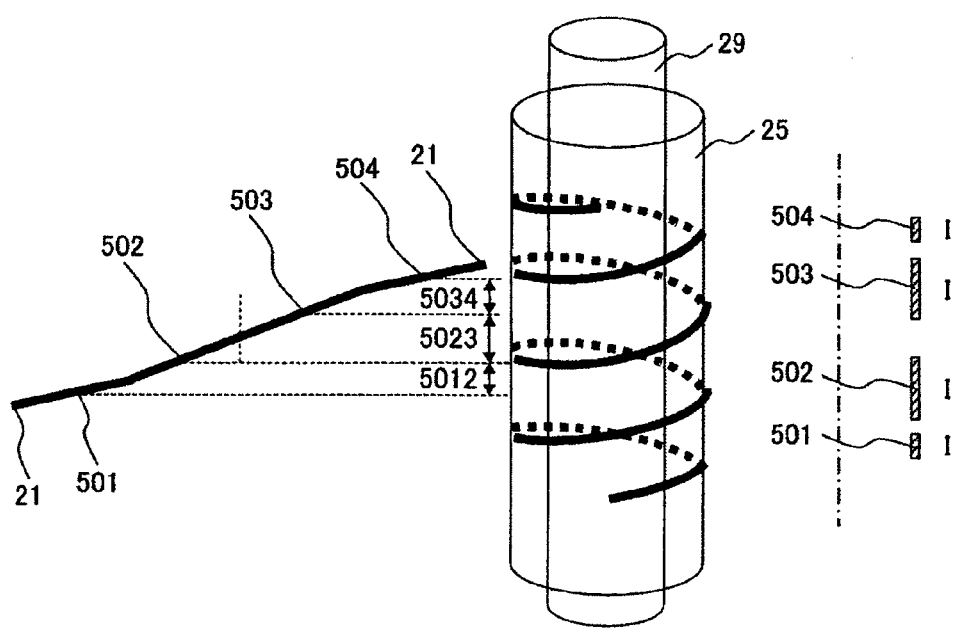
FIG. 16 is a current path development diagram, a current path layout diagram, and a current path cross section diagram of a solenoidal coil that has the characteristics of the fourth and sixth embodiments.

FIG. 13 is a current path development diagram, a current path winding state diagram, and a current path cross section diagram of a solenoidal coil that has the characteristics of the first, fourth, and sixth embodiments. FIG. 14 is a current path development diagram, a current path winding state diagram, and a current path cross section diagram of a solenoidal coil that has the characteristics of the second, fourth, and sixth embodiments. FIG. 15 is a current path development diagram, a current path winding state diagram, and a current path cross section diagram of a solenoidal coil that has the characteristics of the third, fourth, and sixth embodiments. FIG. 16 is a current path development diagram, a current path winding state diagram, and a current path cross section diagram of a solenoidal coil that has the characteristics of the fourth and sixth embodiments.

Any of those configurations further increases the magnetic field homogeneity in a high frequency magnetic field.

Eighth Embodiment

In this embodiment, a solenoidal coil has a positive current path and a negative current path. The parts except the solenoidal coil are the same as those in the first embodiment and, therefore, the following describes only the solenoidal coil.

Figure 17:
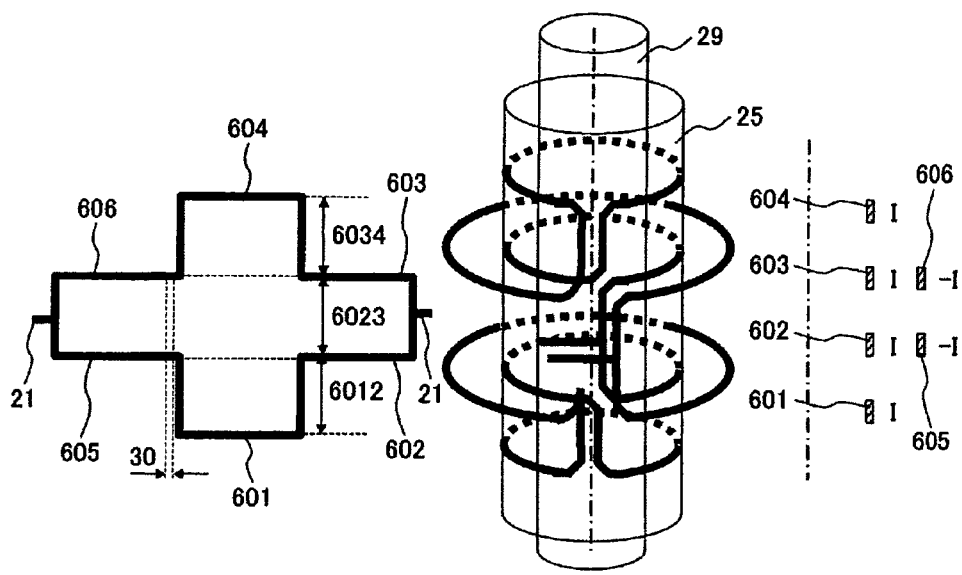
FIG. 17 is a current path development diagram, a current path layout diagram, and a current path cross section diagram of a solenoidal coil in an eighth embodiment.

FIG. 17 is a current path development diagram, a current path winding state diagram, and a current path cross section diagram of a solenoidal coil that has the characteristics of the third embodiment—that is, the current path radius of a fifth ring 605 and a sixth ring 606 is larger than the current path radius of a first ring 601, a second ring 602, a third ring 603, and a fourth ring 604—and that the first to fourth rings have a positive direction current path and the fifth ring 605 and the sixth ring 606 have a negative direction current path. Winding pitches 6012, 6023, and 6034 in the coil axis direction are all equal. Although the cross section of the current path is a rectangle in this embodiment, the solenoidal coil may also be created by using a round wire. The current path in this embodiment may be created by reversing the winding direction with a folding part 30 in the current path development diagram as the border.

The magnetic field generated in a sample space 29 by the first to fourth rings is cancelled by the magnetic field generated by the fifth and sixth rings that have a larger current path radius. This configuration decreases the magnetic field in the center of the coil in the coil axis direction and increases the magnetic field homogeneity in a high frequency magnetic field.

Figure 18:
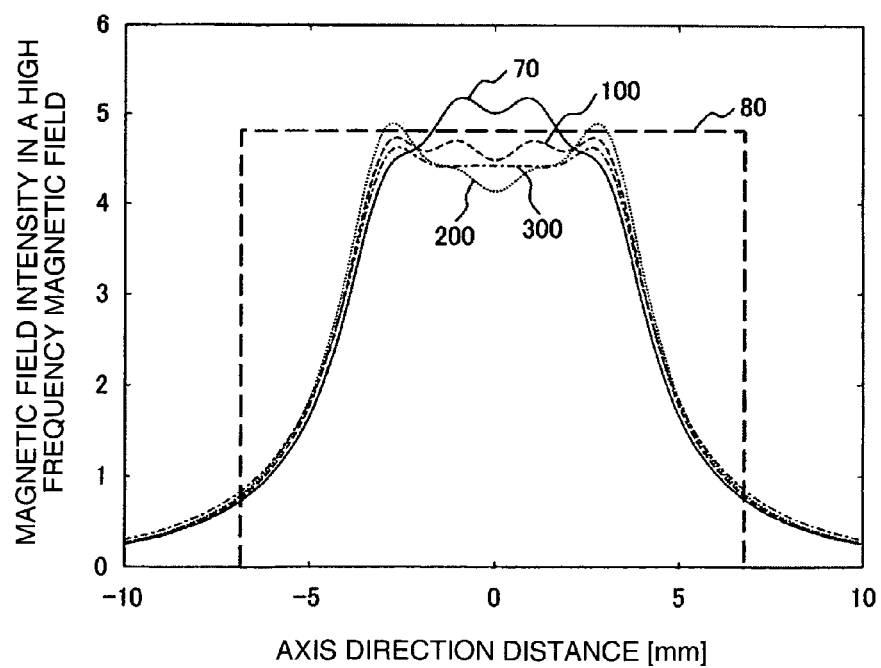
FIG. 18 is a diagram showing the high frequency magnetic field distribution in a sample space calculated in the first, second, and third embodiments.
Figure 19:
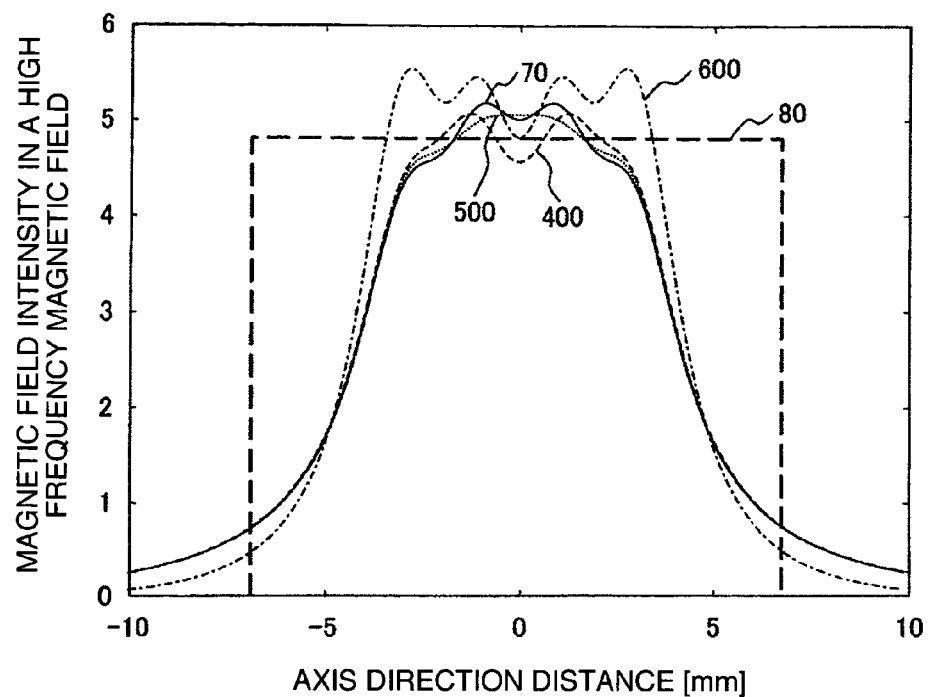
FIG. 19 is a diagram showing the high frequency magnetic field distribution in a sample space calculated in the fourth, sixth, and eighth embodiments.

FIG. 18 and FIG. 19 show the calculated result of the magnetic field distributions in a high frequency magnetic field generated by the solenoidal coils shown in the first, second, third, fourth, sixth, and eighth embodiments. FIGS. 18 and 19 show the magnetic field distributions in an area with the radius of 2.00 mm, where the total of the winding pitches in the coil axis direction is 6 mm and the solenoidal coil radius is 3.2 mm. Because the ideal distribution of the high frequency magnetic field intensity is that the magnetic field intensity is constant in a range of the axial direction distance, a rectangle-like distribution such as the one shown by a magnetic field distribution 80 in FIG. 18 and FIG. 19 is ideal. Now, let's compare the magnetic field distributions of the solenoidal coils in the above embodiments with a magnetic field distribution 70 of the solenoidal coil in the comparison example in which the four windings are equally spaced and the same amount of transmission current flows into the same direction. FIG. 18 indicates that a magnetic field distribution 100 of the coil shown in the first embodiment, a magnetic field distribution 200 of the coil shown in the second embodiment, and a magnetic field distribution 300 of the coil shown in the third embodiment are close to a rectangle. FIG. 19 indicates that a magnetic field distribution 400 of the coil shown in the fourth embodiment, a magnetic field distribution 500 of the coil shown in the sixth embodiment, and a magnetic field distribution 600 of the coil shown in the eighth embodiment are close to a rectangle. Therefore, those distributions indicate that the embodiments described above improve the magnetic field homogeneity in a high frequency magnetic field.

Figure 20:
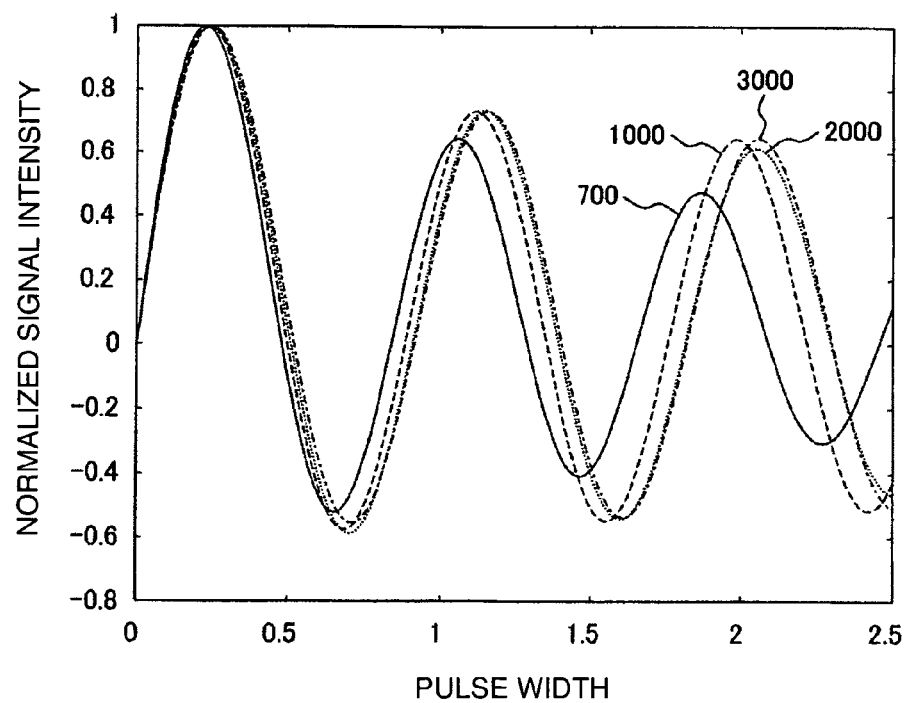
FIG. 20 is a diagram showing the simulation result of an rf homogeneity (810/90) pulse calculated in the first, second, and third embodiments.
Figure 21:
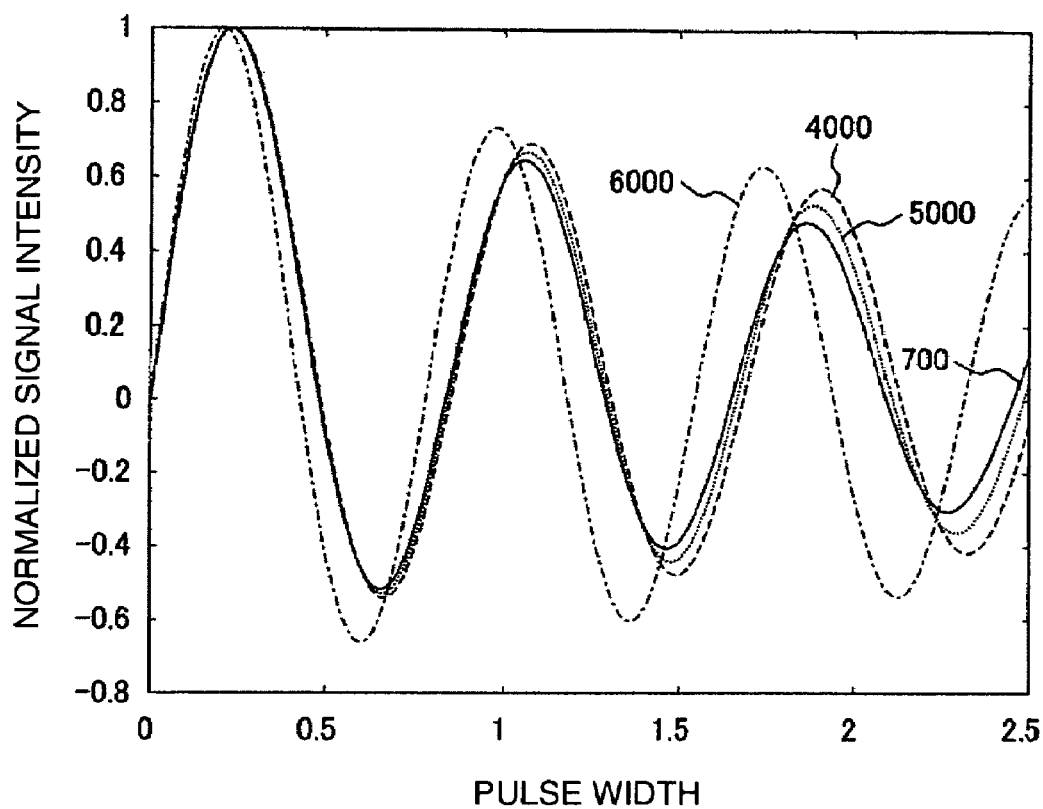
FIG. 21 is a diagram showing the simulation result of an rf homogeneity (810/90) pulse calculated in the fourth, sixth, and eighth embodiments.

FIG. 20 and FIG. 21 show the simulation result of the measurement experiment of the value, which is the index of the homogeneity in a high frequency magnetic field and is called an rf homogeneity (810/90) pulse, based on the magnetic field distributions in the first, second, third, fourth, sixth, and eighth embodiments described above. The range where the magnetic field distribution is calculated is an area with the radius of 0 mm-2.2 mm. The horizontal axis indicates the pulse width during which the pulse is sent to the coil, and the vertical axis indicates the signal intensity generated by normalizing the intensity of the NMR signal, obtained from the sample, by the 90-degree pulse width. The pulse width is increased from zero, the first peak occurs at the 90-degree pulse width, and the second and third peaks occur at the 450-degree pulse width and the 810-degree pulse width respectively. The value generated by dividing the signal intensity of the 810-degree pulse width by the signal intensity of the 90-degree pulse width is the rf homogeneity (810/90) pulse.

When compared with an index 700 of the solenoidal coil in the comparison example in which the four windings are equally spaced and the same amount of transmission current flows in the same direction, FIG. 20 indicates that an index 1000 of the coil shown in the first embodiment, an index 2000 of the coil shown in the second embodiment, and an index 3000 of the coil shown in the third embodiment are improved. FIG. 21 indicates that an index 4000 of the coil shown in the fourth embodiment, an index 5000 of the coil shown in the sixth embodiment, and an index 6000 of the coil shown in the eighth embodiment are improved.

Ninth Embodiment

Although the first to eighth embodiments are means for improving the magnetic field homogeneity in a high frequency magnetic field, it is desirable that the solenoidal coil for the NMR signal not disturb the magnetic field homogeneity in a static magnetic field as much as possible. In this embodiment, the fabrication of a solenoidal coil that does not disturb the homogeneity of the static magnetic field will be described.

Figure 22:
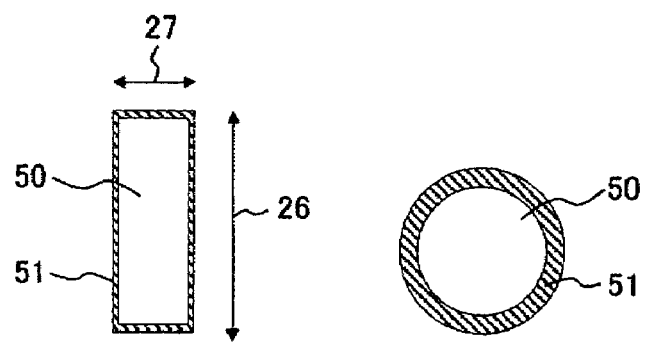
FIG. 22 is a cross section diagram showing a wire material in a ninth embodiment.

FIG. 22 is a cross section diagram showing a rectangle cross section wire and a round wire fabricated by coating an inner material 50 with an outer material 51. When a solenoidal coil for the NMR signal is fabricated, even a low magnetic susceptibility material, usually called non-magnetism, has an impact strong enough to disturb the static magnetic field. Therefore, it is desirable that a positive magnetic susceptibility material and a negative magnetic susceptibility material be used to fabricate a wire such as the one shown in FIG. 22. A positive magnetic susceptibility material is aluminum, tantalum and platinum and so forth, and a negative magnetic susceptibility material is copper, zinc, silver, and gold and so forth. Those positive and negative magnetic susceptibility materials should be combined, one for the outer material and the other for the inner material. Commercially available wires are platinum-plated copper wires and copper aluminum clad wires.

When a solenoidal coil is fabricated using a rectangle cross section wire, the current path thickness 27 can be reduced to fabricate a coil that does not disturb the homogeneity of the static magnetic field. On the other hand, the wire material and the signal frequency determine the skin depth that must be reserved from the surface of the wire as the path way through which the high frequency electric current flows. Failure to reserve the pathway of the skin depth increases the resistance of the coil and, as a result, leads to the loss of the NMR signal. Therefore, the thickness of the current path thickness 27 should be reduced with the lower limit being the twice the skin depth.

Tenth Embodiment

A solenoidal coil for the NMR signal may also be fabricated using a superconductor material. A superconductor, if used, reduces the resistance of the coil and, as a result, reduces the loss of the NMR signal. Because a superconductor material has a critical magnetic field, the material must have the intensity of a critical magnetic field higher than the intensity of the static magnetic field where the solenoidal coil will be used. The superconductor material is, for example, NbTi, $MgB_2$, $V_3Ga$, YBCO, and Bi/Ag tape.

Eleventh Embodiment

Figure 23:
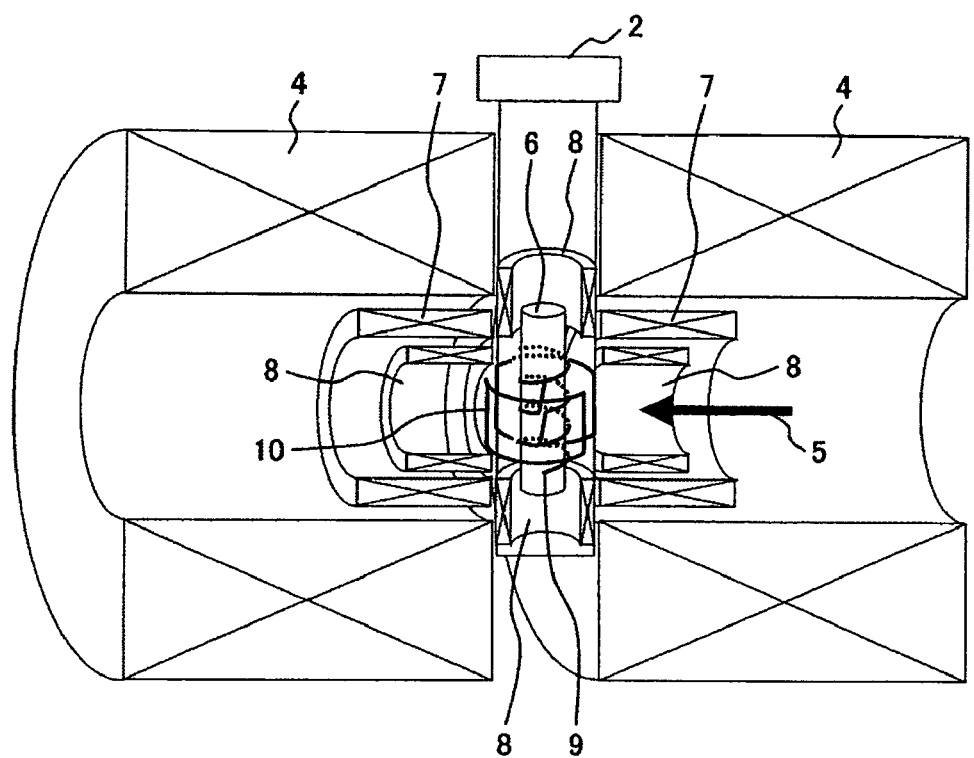
FIG. 23 is a cross section diagram showing the part layout in an eleventh embodiment.

FIG. 23 is a partial cross section diagram showing the configuration in which a probe 2 is inserted from the bore of the radius direction of the static magnetic field magnet. Because the probe is inserted from above and the sample from below in FIG. 23, it is also possible to insert the probe from below and the sample from above. In the eleventh embodiment, a bore 11 in the axial direction of the static magnetic field magnet is the open space of a sample space 6 that may be used as a temperature adjustment system. The rest of the arrangement is the same as that shown in FIG. 2, and the effect of the present invention is the same as those of the embodiments described above.

Twelfth Embodiment

Figure 24:
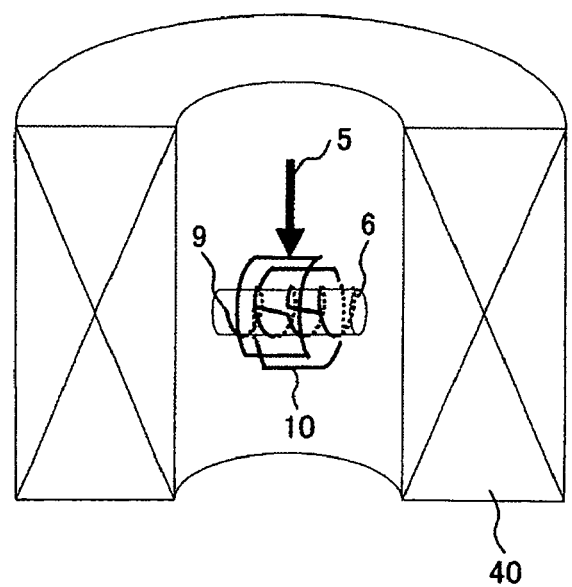
FIG. 24 is a cross sectional diagram showing the part layout in a twelfth embodiment.

Although the longitudinal direction of the sample space 6 extends between two split type static magnetic field generation magnets 4 in the first to eleventh embodiments, it is also possible to use one static magnetic field generation magnet 40 as shown in FIG. 24. In this case, however, it is necessary to disconnect a probe 2 each time a sample is placed in the sample space 6 or to provide a pipe via which a sample is supplied to the sample space 6.

The positional relation between a static magnetic field direction 5 and a sample space 6, inner coil 9, and outer coil 10 can be set in the same way as in FIG. 2 shown in the first embodiment, the effect of the present invention is the same as that described in the embodiments described above.

It should be further understood by those skilled in the art that although the foregoing description has been made on embodiments of the invention, the invention is not limited thereto and various changes and modifications may be made without departing from the spirit of the invention and the scope of the appended claims.

The invention claimed is:

1. A solenoidal coil for an NMR (Nuclear Magnetic Resonance) signal, said solenoidal coil being used for NMR measuring, comprising:
   a plurality of rings formed by a spirally winding said solenoidal coil with a predetermined winding pitch along a solenoidal coil axis;
   a current path branch point provided in an intermediate point of a winding; and
   a current path collection point provided in an intermediate point of said winding;
   wherein at least one of the current path branch point and the current path collection point is provided between two rings from said plurality of rings; and
   wherein a current density at a center portion of said solenoidal coil is less than a current density at an end portion of said solenoidal coil along an axial direction thereof.

2. The solenoidal coil according to claim 1, wherein there are a plurality of current paths connecting feeding points at both ends, the current path collection point is provided in a center of a winding and at a center of a circuit between the two feeding points, and the current paths are geometrically symmetric with respect to the center of the winding.

3. The solenoidal coil according to claim 2, wherein winding pitches in a coil axis direction have predetermined distributions from a center of the coil toward coil ends and the distributions are symmetric with respect to the center of the coil.

4. The solenoidal coil for an NMR signal according to claim 3, wherein current path widths in the coil axis direction have predetermined distributions from the center of the coil toward the coil ends and the distributions are symmetric with respect to the center of the coil.

5. The solenoidal coil for an NMR signal according to claim 2, wherein current path widths in a coil axis direction have predetermined distributions from a center of the coil toward coil ends and the distributions are symmetric with respect to the center of the coil.

6. The solenoidal coil according to claim 1, wherein more current paths are provided in the intermediate part than in a part of the winding connected to feeding points at both ends, and wherein one or more rings are provided between the feeding point and the current path branch point, and one or more rings are provided between the feeding point and the current path collection point.

7. The solenoidal coil according to claim 6, wherein winding pitches in a coil axis direction have predetermined distributions from a center of the coil toward coil ends and the distributions are symmetric with respect to the center of the coil.

8. The solenoidal coil for an NMR signal according to claim 7, wherein current path widths in the coil axis direction have predetermined distributions from the center of the coil toward the coil ends and the distributions are symmetric with respect to the center of the coil.

9. The solenoidal coil for an NMR signal according to claim 6, wherein current path widths in a coil axis direction have predetermined distributions from a center of the coil toward coil ends and the distributions are symmetric with respect to the center of the coil.

10. The solenoidal coil according to claim 1, wherein said solenoidal coil has both a current path for generating a positive magnetic field and a current path for generating a negative magnetic field in a coil axis direction, wherein the positive magnetic field and the negative magnetic field are generated at the same time and partly negated.

11. A NMR signal acquisition device comprising:
   a static magnetic field generator;
   a static magnetic field homogeneity compensation unit;
   a gradient field generator;
   a solenoidal coil for an NMR signal, said solenoidal coil comprising:
   a plurality of rings formed by spirally winding said solenoidal coil with a predetermined winding pitch along a solenoidal coil axis;
      a current path branch point provided in an intermediate point of a winding, and
      a current path collection point provided in an intermediate point of said winding:
   a probe on which said solenoidal coil is mounted; and
   a control unit that sends a high frequency current to said solenoidal coil for a NMR signal for acquiring the NMR signal,
   wherein at least one of the current path branch point and the current path collection point is provided between two rings from said plurality of rings, and
   wherein current density at a center portion of said solenoidal coil is smaller than current density at an end portion of said solenoidal coil in an axial direction of said solenoidal coil.

* * * * *